(12) United States Patent
Gribok

(10) Patent No.: US 8,095,848 B1
(45) Date of Patent: Jan. 10, 2012

(54) MULTI-BYTE CYCLIC REDUNDANCY CHECK CALCULATION CIRCUIT AND METHOD OF OPERATING THE SAME

(75) Inventor: Sergey Y. Gribok, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 783 days.

(21) Appl. No.: 12/233,579

(22) Filed: Sep. 18, 2008

(51) Int. Cl.
*H03M 13/00* (2006.01)
(52) U.S. Cl. ...................... 714/758; 714/807
(58) Field of Classification Search .................. 714/758, 714/807
See application file for complete search history.

(56) References Cited

U.S. PATENT DOCUMENTS

| | | | |
|---|---|---|---|
| 6,295,626 B1 | 9/2001 | Nair et al. | |
| 6,442,747 B1 * | 8/2002 | Schzukin | 716/103 |
| 6,779,150 B1 * | 8/2004 | Walton et al. | 714/763 |
| 7,398,449 B1 * | 7/2008 | Normoyle et al. | 714/767 |
| 7,734,965 B1 * | 6/2010 | Barash | 714/712 |

* cited by examiner

*Primary Examiner* — M. Mujtaba K Chaudry

(57) ABSTRACT

A multi-byte cyclic redundancy check (CRC) calculation circuit and a method of calculating a multi-byte CRC. In one embodiment, the circuit includes: (1) a plurality of modules each configured to receive remainder bits in first inputs thereof and different numbers of portions of an input message in second inputs thereof and compute candidate CRC bits based thereon, (2) a storage element configured to receive output bits from one of the plurality of modules and provide the output bits to the first inputs as the remainder bits and (3) a multiplexer coupled to first outputs of the plurality of modules and configured to select from among the candidate CRC bits to yield a CRC for the input message.

20 Claims, 2 Drawing Sheets

MULTI-BYTE CYCLIC REDUNDANCY CHECK CALCULATION CIRCUIT AND METHOD OF OPERATING THE SAME

TECHNICAL FIELD

The invention is directed, in general, to error detecting codes and, more specifically, to a multi-byte cyclic redundancy check (CRC) calculation circuit and method of operating the same to calculate a CRC.

BACKGROUND

CRC is widely employed in digital communication and storage systems. CRC is a type of checksum used to detect errors in a transmitted sequence of data, called an input message.

CRC is based on a division of a polynomial $H(x)$ over a binary finite field $GF(2)$. A so-called generator polynomial $G(x) = x^n g_{n-1} x^{n-1} + \ldots + g_2 x^2 + g_1 x + g_0$ is selected to define an n-bit CRC ("CRC-n"). Input bits of the input message are considered as coefficients of $H(x)$ over $GF(2)$. $H(x)$ is then divided by $G(x)$. The coefficients of the remainder polynomial become the bits of the CRC.

A straightforward CRC circuit employs a single linear feedback shift register (see, e.g., U.S. Pat. No. 6,295,626, which issued to Nair, et al., on Sep. 25, 2001, entitled "Symbol Based Algorithm for Hardware Implementation of Cyclic Redundancy Check"). Unfortunately, since this circuit processes the input message only one bit at a time, the input message must be serially streamed to the circuit to generate a CRC. Consequently, generation of a CRC requires as many clock cycles as the input message has bits. Most digital communication and storage applications employ input messages that are too long for this simple CRC circuit to be practical.

U.S. Pat. No. 6,295,626 discloses a way to process multiple bits of the input message at a time. According to U.S. Pat. No. 6,295,626, it is possible to build a hardware module $M_k$ that generates a CRC for k bits of an input message at a time. The module $M_k$ receives a k-bit-wide input value A (a current message word) and an n-bit-wide input value R (a current value of the remainder) and produces an n-bit-wide value Z (a new value of the remainder). The maximum logic depth of the module $M_k$ is only $\log_2(n+k)$ levels. Consequently, CRC calculation using such a module is faster than with linear feedback shift register.

A single instance of the module $M_k$, having its output connected to its first input, may be used to calculate CRCs if the total input message size m is evenly divisible by the module input width k. For example, if every input message is guaranteed to contain exactly 64×p bits, p being an arbitrary integer, a single module $M_{64}$ receiving exactly 64 bits of the input message every clock cycle can suitably implement a CRC circuit.

However, many applications in which CRC generation may be required cannot guarantee that the input message size m is evenly divisible by the CRC module input width k. Stated another way, a single module $M_k$ cannot produce a CRC for an input message having a size m, where m is not an even multiple of k. For all input messages for which m is not an even multiple of k, the last piece of the input message received by the module $M_k$ will be less than k, and the module $M_k$ will produce an incorrect CRC.

SUMMARY

To address the above-discussed deficiencies of the prior art, one aspect of the invention provides a multi-byte CRC calculation circuit. In one embodiment, the circuit includes: (1) a plurality of modules each configured to receive remainder bits in first inputs thereof and different numbers of portions of an input message in second inputs thereof and compute candidate CRC bits based thereon, (2) a storage element configured to receive output bits from one of the plurality of modules and provide the output bits to the first inputs as the remainder bits and (3) a multiplexer coupled to first outputs of the plurality of modules and configured to select from among the candidate CRC bits to yield a CRC for the input message.

Another embodiment of the circuit includes: (1) a plurality of modules each configured to receive remainder bits in first inputs thereof, a $D^{th}$ one of the plurality of the modules configured to receive D portions of an input message that is D portions long at D second inputs thereof and compute candidate CRC bits based thereon, (2) a storage element configured to receive output bits from one of the plurality of modules and provide the output bits to the first inputs as the remainder bits and (3) a multiplexer coupled to first outputs of the plurality of modules and configured to select from among the candidate CRC bits to yield a CRC for the input message.

Another aspect of the invention provides a method of calculating a multi-byte CRC. In one embodiment, the method includes: (1) receiving remainder bits in first inputs of a plurality of modules, (2) receiving different numbers of portions of an input message in second inputs of the plurality of modules, (3) computing candidate CRC bits based on the remainder bits and the different numbers, (4) providing output bits from one of the plurality of modules to the first inputs as the remainder bits and (5) selecting from among the candidate CRC bits to yield a CRC for the input message.

The foregoing has outlined certain aspects and embodiments of the invention so that those skilled in the pertinent art may better understand the detailed description of the invention that follows. Additional aspects and embodiments will be described hereinafter that form the subject of the claims of the invention. Those skilled in the pertinent art should appreciate that they can readily use the disclosed aspects and embodiments as a basis for designing or modifying other structures for carrying out the same purposes of the invention. Those skilled in the pertinent art should also realize that such equivalent constructions do not depart from the scope of the invention.

BRIEF DESCRIPTION OF THE DRAWINGS

For a more complete understanding of the invention, reference is now made to the following descriptions taken in conjunction with the accompanying drawings, in which.

DETAILED DESCRIPTION OF CERTAIN ASPECTS AND EMBODIMENTS

Figure 1:
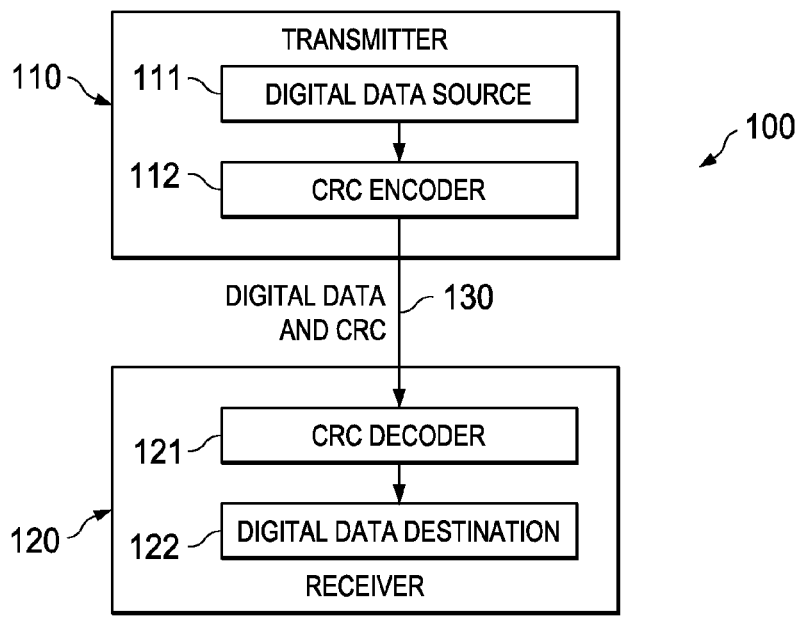
FIG. 1 is a high-level block diagram of a digital communication system or a storage system that forms an environment within which various embodiments of a multi-byte CRC calculation circuit constructed according to the principles of the invention can operate.

FIG. 1 is a high-level block diagram of a digital communication or storage system 100 that forms an environment within which various embodiments of a multi-byte CRC calculation circuit constructed according to the principles of the invention can operate. The system 100 includes a transmitter 110 and a receiver 120. Digital data, including associated CRCs, are transmitted from the transmitter 110 to the receiver 120 along a communication link, which may be electrical or optical or of any other type and bandwidth whatsoever. The transmitter 110 transmits the digital data. The transmitter 110 includes a digital data source 111, which may be of any type or kind whatsoever. A CRC encoder 112 is coupled to the digital data source and is configured to generate CRC codes based on sequences of data, or input messages, provided by the digital data source 110. The receiver 120 receives the digital data. The receiver 120 includes a CRC decoder 121. The CRC decoder 121 is configured to use the CRC codes generated by the CRC encoder 112 to determine whether or not the digital data it has received contains errors and perhaps also to repair some or all of any errors it may detect. The receiver 120 also includes a digital data destination 122. The digital data destination 122 is configured to further process or store the digital data as a particular application may find advantageous.

To understand how the various embodiments of the novel multi-byte CRC calculation circuit operate advantageously, CRC-calculation requirements will now be described. A CRC circuit is tasked with implementing CRC-n (i.e., the CRC output width of n bits, n being, for example, 32). The input message has an arbitrary number of w-bit-wide pieces (for example, if w=8 then the input message contains an arbitrary number of bytes). In one conventional CRC circuit constructed in accordance with U.S. Pat. No. 6,295,626, each module has an input width k divisible by w; k/w=d (as an example k=64, d=64/8=8). In other words, each module's input receives d data bytes.

The input bits $b_0, \ldots, b_{k-1}$ are divided onto d bytes:
$s_1 = \{b_0, \ldots, b_{w-1}\}$,
$s_2 = \{b_w, \ldots, b_{2w-1}\}$,
...
$s_d = \{b_{(d-1)w}, \ldots, b_{k-1}\}$ The CRC circuit overall includes d instances of $M_w$ modules.

The $i^{th}$ data byte is provided to the second input of the $i^{th}$ module $M_w$:
$(1 \leq i \leq d)$.

The output of the $i^{th}$ module $(1 \leq i < d)$ is connected to the first input of the $(i+1)^{th}$ module. The output of the $d^{th}$ (last) module is connected with the D input of a flip-flop. The Q output of the flip-flop is connected with the first input of the $1^{st}$ CRC-calculation module.

The output of every instance of $M_w$ goes directly to multiplexing circuitry. Depending on the input message size, the multiplexing circuitry selects the right module output to provide the CRC. A disadvantage of the architecture is an increased logic depth: $d \times \log_2(n+w)$. For the example above, the total logic depth is 48 logic levels. What is needed therefore is a CRC calculation circuit that outperforms conventional CRC circuits and allows high frequency CRC calculation.

Figure 2:
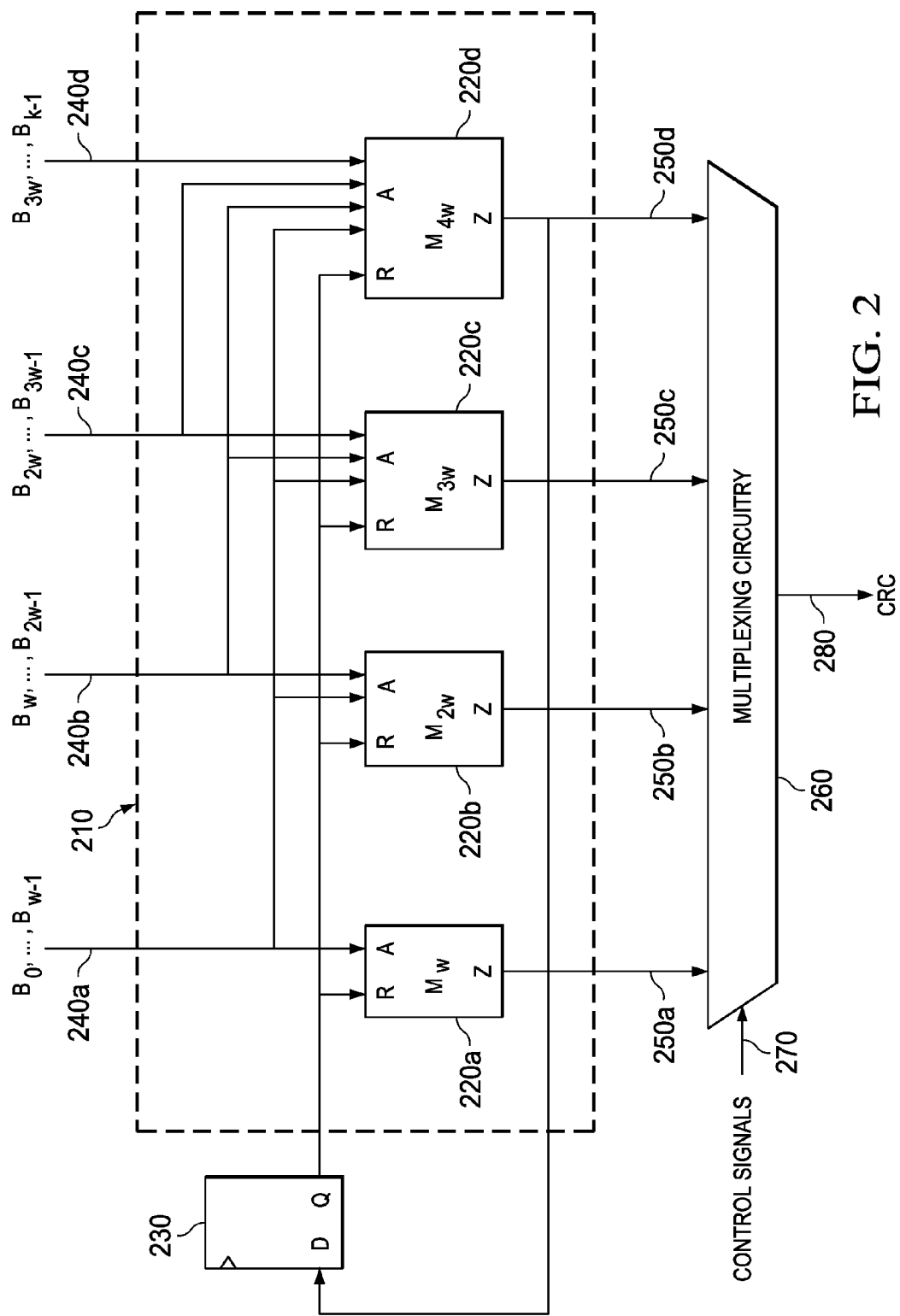
FIG. 2 is a block diagram of one embodiment of a multi-byte CRC calculation circuit constructed according to the principles of the invention.

Disclosed herein are various CRC calculation hardware architectures that have a substantially reduced logic depth compared to the conventional architectures. Fundamentally, instead of using d sequential stages, d parallel stages are used. FIG. 2 is a block diagram of one embodiment of a multi-byte CRC calculation circuit 200 constructed according to the principles of the invention.

The circuit contains d modules 210: $M_w, M_{2w}, \ldots, M_{dw}$ 220a, 220b, 220c, 220d. Input bits $\{b_0, \ldots, b_{iw-1}\}$ 240a, 240b, 240c, 240d are received into the A (second) input of the modules 210 $M_{iw}$ $(1 \leq i \leq d)$ 220a, 220b, 220c, 220d. More specifically, input bits $\{b_0, \ldots, b_{w-1}\}$ 240a are received into the A input of the module $M_w$ 220a; input bits $\{b_0, \ldots, b_{2w-1}\}$ 240a, 240b are received into the A input of the module $M_{2w}$ 220b; input bits $\{b_0, \ldots, b_{3w-1}\}$ 240a, 240b, 240c are received into the A input of the module $M_{3w}$ 220c; and input bits $\{b_0, \ldots, b_{3w-1}\}$ 240a, 240b, 240c, 240d are received into the A input of the module $M_{4w}$ 220d. The modules 210 $M_{iw}$ $(1 \leq i \leq d)$ 220a, 220b, 220c, 220d produce outputs 250a, 250b, 250c, 250d. The output 250d of the last module $M_{dw}$ 220d is provided to the D input of a DQ flip-flop 230. The Q output of the DQ flip-flop 230 is provided to the R (first) input of each of the modules $M_{iw}$ $(1 \leq i \leq d)$ 220a, 220b, 220c, 220d. A Z (first) output of every module $M_{iw}$ 220a, 220b, 220c, 220d is provided to multiplexing circuitry 260, which receives control signals 270 and produces an output 280 based thereon. For the example above, one embodiment of the multiplexing circuitry 260 has four multi-bit data inputs A1, A2, A3, A4 respectively coupled to the outputs 250a, 250b, 250c, 250d and four 1-bit control inputs S1, S2, S3, S4. This embodiment of the multiplexing circuitry 260 implements the logic function:

$$S1*A1+S2*A2+S3*A3+S4*A4,$$

where * is a logical AND, and + is a logical OR.

The modules $M_{iw}$ $(1 \leq i \leq d)$ 220a, 220b, 220c, 220d exclusively ORs (XORs) the bits provided by the flip-flop 230 at their R inputs and the input bits $\{b_0, \ldots, b_{w-1}\}$ 240a provided at their A inputs in a configuration described in detail in U.S. Pat. No. 6,295,626, supra., which is incorporated herein by reference. As is evident in FIG. 2, the modules $M_{iw}$ $(1 \leq i \leq d)$ 220a, 220b, 220c, 220d work in parallel. That is, portions of the input message are provided to multiple modules. One portion, consisting of the input bits $\{b_0, \ldots, b_{w-1}\}$ 240a, is provided to all four modules in the embodiment of FIG. 2. Because the modules $M_{iw}$ $(1 \leq i \leq d)$ 220a, 220b, 220c, 220d work in parallel, the maximum logic depth of the circuit equals the depth of the largest module $M_{4w}$, viz.:

$$H(S)=H(M_{dw})=\log_2(n+dw)$$

In the embodiment of FIG. 2, the total logic depth is seven, which is almost seven times less than the logic depth for the conventional CRC circuit described above.

Figure 3:
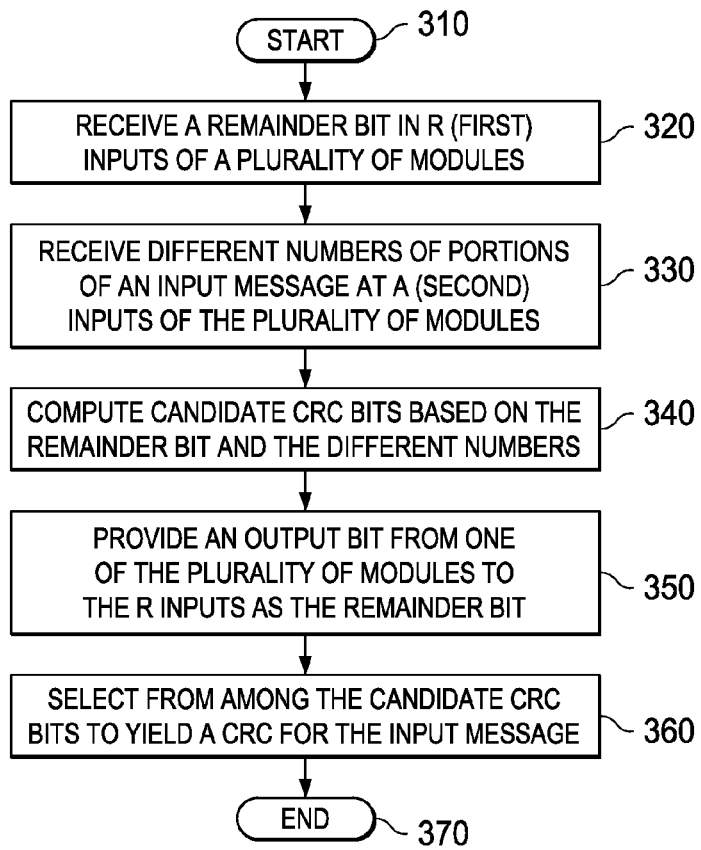
FIG. 3 is a flow diagram of one embodiment of a method of calculating a multi-byte CRC carried out according to the principles of the invention.

FIG. 3 is a flow diagram of one embodiment of a method of calculating a multi-byte CRC carried out according to the principles of the invention. The method begins in a start step 310. In a step 320, remainder bits is received in R (first) inputs of a plurality of modules. In a step 330, different numbers of portions of an input message are received in A (second) inputs of the plurality of modules. In a step 340, the plurality of modules compute candidate CRC bits based on the remainder bits and the different numbers. In a step 350, output bits from one of the plurality of modules is provided to the first inputs as the remainder bits. In a step 360, a CRC for the input message is selected from among the candidate CRC bits. The method ends in a start step 370.

Those skilled in the art to which the invention relates will appreciate that other and further additions, deletions, substitutions and modifications may be made to the described embodiments without departing from the scope of the invention.

What is claimed is:

1. A multi-byte cyclic redundancy check calculation circuit, comprising:
 a plurality of modules each configured to receive remainder bits in first inputs thereof and different numbers of portions of an input message in second inputs thereof and compute candidate cyclic redundancy check bits based thereon;
 a storage element configured to receive output bits from one of said plurality of modules and provide said output bits to said first inputs as said remainder bits; and
 a multiplexer coupled to first outputs of said plurality of modules and configured to select from among said candidate cyclic redundancy check bits to yield a cyclic redundancy check for said input message.

2. The circuit as recited in claim 1 wherein a $D^{th}$ one of said plurality of said modules is configured to receive D portions of said input message.

3. The circuit as recited in claim 1 wherein a $D^{th}$ one of said plurality of said modules has D of said second inputs.

4. The circuit as recited in claim 1 wherein said circuit consists of four of said modules, said portions each constituting one quarter of said input message.

5. The circuit as recited in claim 1 wherein said input message is of an arbitrary byte length.

6. The circuit as recited in claim 1 wherein a maximum logic depth of said circuit equals a logic depth of a largest one of said plurality of modules.

7. The circuit as recited in claim 1 wherein said storage element is a flip-flop.

8. A method of calculating a multi-byte cyclic redundancy check, comprising:
 receiving remainder bits in first inputs of a plurality of modules;
 receiving different numbers of portions of an input message in second inputs of said plurality of modules;
 computing candidate cyclic redundancy check bits based on said remainder bits and said different numbers;
 providing output bits from one of said plurality of modules to said first inputs as said remainder bits; and
 selecting from among said candidate cyclic redundancy check bits to yield a cyclic redundancy check for said input message.

9. The method as recited in claim 8 wherein a $D^{th}$ one of said plurality of said modules is configured to receive D portions of said input message.

10. The method as recited in claim 8 wherein a $D^{th}$ one of said plurality of said modules has D of said second inputs.

11. The method as recited in claim 8 wherein said plurality of modules is four of said modules, said portions each constituting one quarter of said input message.

12. The method as recited in claim 8 wherein said input message is of an arbitrary byte length.

13. The method as recited in claim 8 wherein a maximum logic depth of said circuit equals a logic depth of a largest one of said plurality of modules.

14. The method as recited in claim 8 wherein said storage element is a flip-flop.

15. A multi-byte cyclic redundancy check calculation circuit, comprising:
 a plurality of modules each configured to receive remainder bits in first inputs thereof, a $D^{th}$ one of said plurality of said modules configured to receive D portions of an input message that is D portions long at D second inputs thereof and compute candidate cyclic redundancy check bits based thereon;
 a storage element configured to receive output bits from one of said plurality of modules and provide said output bits to said first inputs as said remainder bits; and
 a multiplexer coupled to first outputs of said plurality of modules and configured to select from among said candidate cyclic redundancy check bits to yield a cyclic redundancy check for said input message.

16. The circuit as recited in claim 15 wherein D equals four.

17. The circuit as recited in claim 15 wherein said input message is of an arbitrary byte length.

18. The circuit as recited in claim 15 wherein a maximum logic depth of said circuit equals a logic depth of a largest one of said plurality of modules.

19. The circuit as recited in claim 15 wherein said storage element is a flip-flop.

20. The circuit as recited in claim 15 wherein said circuit is employed in a selected one of:
 a digital communication system, and
 a storage system.

* * * * *